(12) United States Patent
Babbs et al.

(10) Patent No.: US 6,520,727 B1
(45) Date of Patent: Feb. 18, 2003

(54) MODULAR SORTER

(75) Inventors: Daniel Babbs, Austin, TX (US); Timothy Ewald, Austin, TX (US); Matthew Coady, Round Rock, TX (US); William J. Fosnight, Austin, TX (US)

(73) Assignee: Asyt Technologies, Inc., Fremont, CA (US)

( * ) Notice: Subject to any disclaimer, the term of this patent is extended or adjusted under 35 U.S.C. 154(b) by 0 days.

(21) Appl. No.: 09/547,829

(22) Filed: Apr. 12, 2000

(51) Int. Cl.[7] .............................................. B65G 49/07
(52) U.S. Cl. ...................................... 414/217; 414/939
(58) Field of Search .................................. 414/217, 939

(56) References Cited

U.S. PATENT DOCUMENTS

| | | | |
|---|---|---|---|
| 4,532,970 A | 8/1985 | Tullis | |
| 4,534,389 A | 8/1985 | Tullis | |
| 4,676,002 A | 6/1987 | Slocum | |
| 4,775,281 A | 10/1988 | Prentakis | |
| 4,815,912 A | 3/1989 | Maney | |
| 4,911,810 A | * 3/1990 | Lauro et al. ........... | 204/192.12 |
| 4,995,430 A | 2/1991 | Bonora | |
| 5,464,313 A | * 11/1995 | Ohsawa ..................... | 414/172 |
| 5,518,542 A | 5/1996 | Matsukawa | |
| 5,626,456 A | 5/1997 | Nishi | |
| 5,647,718 A | 7/1997 | Wiesler | |
| 5,789,890 A | 8/1998 | Genov | |
| 5,920,679 A | 7/1999 | Ge | |
| 6,050,891 A | * 4/2000 | Nering ....................... | 454/187 |
| 6,082,949 A | 7/2000 | Rosenquist | |
| 6,091,498 A | * 7/2000 | Hanson et al. .............. | 356/375 |
| 6,155,768 A | 12/2000 | Bacchi | |
| 6,298,280 B1 | 10/2001 | Bonora | |
| 6,326,755 B1 | 12/2001 | Babbs | |

OTHER PUBLICATIONS

U.S. patent application Ser. No. 09/483,625, Bonora, filed Jan. 15, 1999.
Parikh, M., Smif: A Technology Wafer Cassette Transfer in VLSI Manufacturing, Solid State Technology, Jul. 1984, pp. 111–115.

* cited by examiner

Primary Examiner—Steven A. Bratlie
(74) Attorney, Agent, or Firm—O'Melveny & Myers, LLP

(57) ABSTRACT

A modular sorter is disclosed in which modular sections maybe easily added and removed to add and remove load port assemblies as required by a particular wafer fabrication run. In one embodiment, a modular sorter according to the present invention include a two-wide modular section defining a minienvironment for the sorter, a wafer handling robot a pair of aligners and a centralized controller. The modular section of this embodiment includes a pair of side-by-side load port assemblies for receiving a container or open cassette and presenting the cassette to the minienvironment of the sorter for processing of the wafers therein. The present invention further includes a removable end panel. When it is desired to add additional modular sections to the sorter, the end panel is removed and replaced by a connector frame. The connector frame allows additional modular sections, including either one load port assembly or two load port assemblies, to be attached to the original modular section. All of the power and control components for the modular sections are preferably located in the centralized controller. Upon attachment of the additional modular section, the power and signal connections for the additional section are plugged into the controller. The controller then recognizes the additional section and changes the overall operation scheme to now operate as a three-wide sorter or a four-wide sorter.

43 Claims, 16 Drawing Sheets

MODULAR SORTER

CROSS-SECTION TO RELATED PATENTS/APPLICATIONS

The present application is related to the following patents applications, which are assigned to the owner of the present invention and which are incorporated in their entirety herein:

U.S. patent application Ser. No. 09/547,551 entitled "A SYSTEM FOR PARALLEL PROCESSING OF WORKPIECES", by Babbs et al., filed on Apr. 12, 2000, and issued on Dec. 4, 2001 as U.S. Pat. No. 6,326,755; and U.S. patent application Ser. No. 09/452,059, entitled "A WAFER ORIENTING AND READING MECHANISM", filed on Nov. 30, 1999, which application is currently pending.

BACKGROUND OF THE INVENTION

1. Field of the Invention

The present invention relates to a compact sorter for transferring semiconductor wafers or other workpieces between cassettes and/or work stations, and in particular to a modular sorter in which additional modular sections may be added and removed, and in which processing speed of the workpieces may be increased over conventional sorters.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

In order to transfer wafers between a SMIF pod and a processing tool within a wafer fab, a pod is typically loaded either manually or automatedly onto a load port assembly on a front of the tool. The processing tool includes an access port which, in the absence of a pod, is generally covered by a port door. Once the pod is positioned on the load port, mechanisms within the port door unlatch the pod door from the pod shell and the pod door and shell are thereafter separated. A wafer handling robot within the processing tool may thereafter access particular wafers supported in wafer slots in the pod or cassette for transfer between the pod and the processing tool.

One example of a processing tool in a wafer fab is a wafer sorter which is used at various points during the semiconductor fabrication process to perform a number of different functions. One such function of a wafer sorter is to transfer one or more wafers between the various cassettes positioned within the wafer sorter. The wafers can be transferred between the cassettes in the same order or reordered as desired. Another function of a wafer sorter is to map the location of wafers within a cassette, and to detect incorrect positioning of wafers within a cassette.

Wafer alignment and identification may also be carried out in a wafer sorter by a tool referred to as an aligner. Conventional aligners include a chuck for supporting and rotating a wafer and a sensor for identifying a radial runout (i.e., a magnitude and direction by which the workpiece deviates from a centered position on the chuck), and for identifying the position of a notch located along the circumference of the wafer. Aligners generally further include a camera for reading an optical character recognition (OCR) mark that identifies the workpiece. The OCR mark is provided a known distance from the wafer notch, so that once the notch is located, the wafer may be rotated to position the OCR mark under the camera. In a conventional wafer sorter, wafers are transferred one at a time to the chuck of the aligner by a wafer handling robot further provided within the sorter. The chuck then rotates the wafer to allow the radial runout to be determined, the location of the notch to be identified, and the OCR mark to be read. Thereafter, the wafer is reacquired by the robot on center, and returned to one of the cassettes positioned on the sorter.

Typical wafer fabrication recipes utilize two-wide sorters, i.e., sorters including two side-by-side load port assemblies capable of together loading two wafer-carrying cassettes into the sorter. However, occasionally, operations require three-wide sorter units and four-wide sorter units, for example where it is desired to split wafers from one cassette into two or three other cassettes, or visa-versa. Though seldom used, semiconductor manufacturers must provide three-wide and four-wide sorters. While it might be possible to utilize a four-wide sorter in all operations and only utilize that portion of the sorter necessary for a particular operation, four-wide sorters take up valuable floor space in the wafer fab.

A further disadvantage to conventional wafer sorters is the speed with which wafer transfer and aligner operations are carried out. In conventional sorters, the workpiece handling robot must first transfer the workpiece from the cassette to the aligner, the aligner then identifies the radial runout, notch position and OCR mark and then the robot transfers the wafer back to the original or new cassette. The robot sits idle while the aligner performs its operations, and the aligner sits idle while the robot transfers the wafers to and from the aligner. Conventional workpiece sorters therefore have a relatively low throughput, on the order of approximately 200–250 workpieces per hour. As there are several workpiece sorters within a fab, this low throughput can become significant.

It is known to provide dual armed robots to increase throughput. One such dual armed robot is disclosed in U.S. Pat. No. 5,789,890 to Genov et al., entitled "ROBOT HAVING MULTIPLE DEGREES OF FREEDOM". As disclosed therein, such robots typically include multiple arms offset from each other so as to be able to obtain a first workpiece from the cassette, spin around, and then acquire a second workpiece. Such robots take up a significant amount of space within the sorter, where space is at a premium owing to the expense of maintaining the ultraclean minienvironment. Moreover, typical dual armed robots are expensive, and require more complicated controls.

SUMMARY OF THE INVENTION

It is therefore an advantage of the present invention to provide a modular sorter in which the number of load port assemblies affixed to the sorter may be increased or decreased.

It is another advantage of the present invention to reduce equipment costs and to promote more efficient usage of equipment through the use of modular sections.

It is a further advantage of the present invention to increase throughput by reducing idle time of the aligner and idle time of the workpiece transfer robot.

It is a still further advantage of the present invention to provide a centralized control unit which may be easily accessed for repair, upgrade or replacement of controller components.

It is another advantage of the present invention to provide a centralized control unit which allows quick and easy addition or subtraction of modular sections to the modular sorter.

It is a further advantage of the present invention to provide a modular sorter of compact size.

These and other advantages are provided by the present invention which in general relates to a modular sorter in which modular sections may be easily added and removed to add and remove load port assemblies as required by a particular wafer manufacturing facility. In one embodiment, a modular sorter according to the present invention includes a two-wide modular section defining a minienvironment for the sorter, a wafer handling robot, a pair of aligners and a centralized controller. The modular section of this embodiment includes a pair of side-by-side load port assemblies for receiving a container or open cassette and presenting the cassette to the sorter minienvironment for processing of the wafers therein.

The two-wide modular section sorter may be easily modified to include additional modular sections with additional load port assemblies. In particular, the present invention includes a removable end panel affixed for example by removable bolts to the end of the two-wide modular section. When it is desired to add additional modular sections to the sorter, the end panel is removed and replaced by a connector frame. An additional modular section, having either one or two load port assemblies, may then be attached to the connector frame.

All of the power and control components for the modular sections are preferably located in the centralized controller. Upon attachment of the additional modular section, the power and signal connections for the additional section are plugged into the controller. The controller may then be configured operate as a three-wide sorter or a four-wide sorter through simple commands entered via the controller graphical interface. It is contemplated that the controller alternatively recognize the additional modular sections automatically, and configure the system to operate accordingly.

BRIEF DESCRIPTION OF THE DRAWINGS

The invention will now be described with reference to the drawings in which.

DETAILED DESCRIPTION

Figure 1:
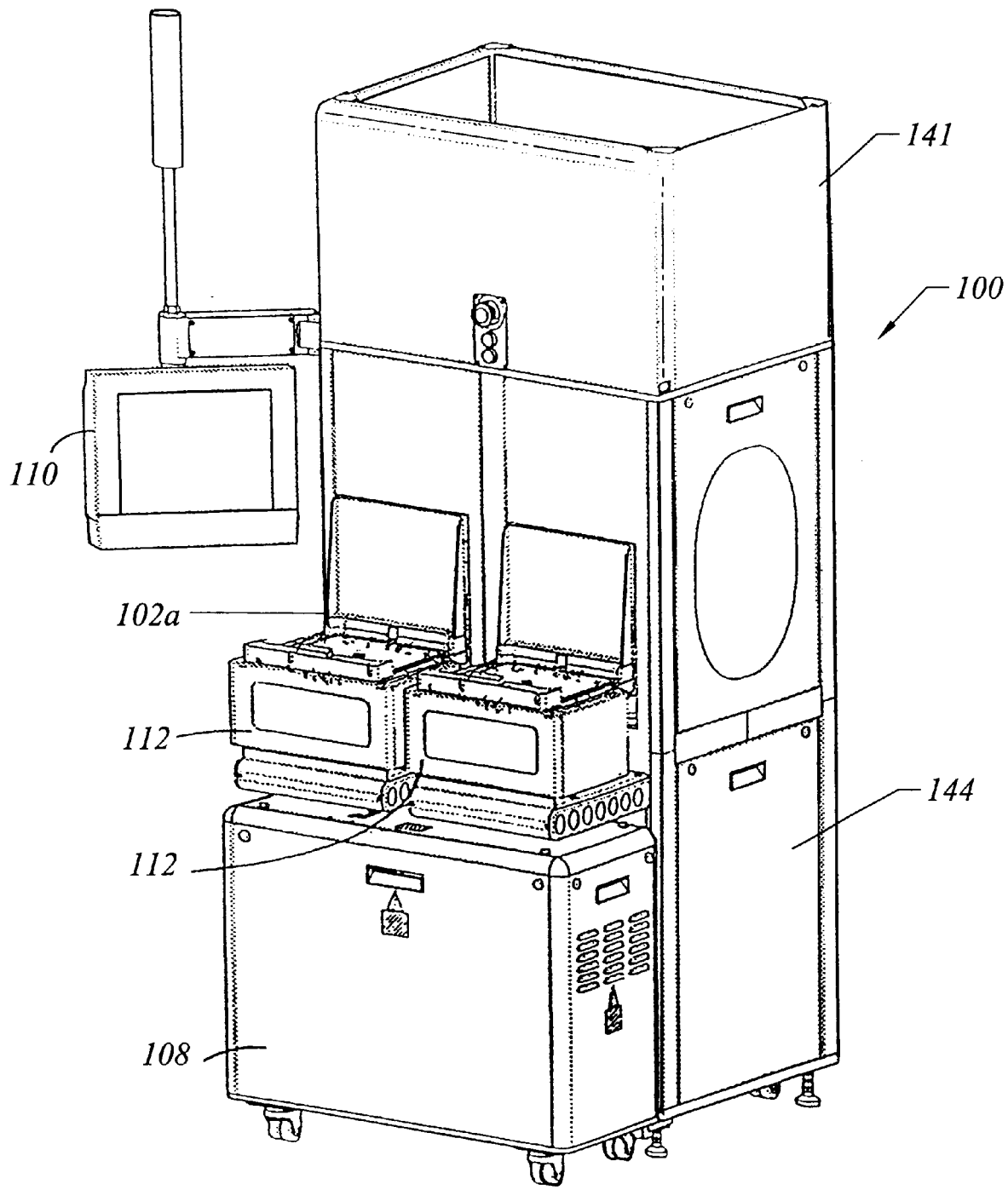
FIG. 1 is a front perspective view of a two-wide modular sorter.

The present invention will now be described with reference to FIGS. 1–19 which in general relate to a modular sorter in which modular sections may be added and removed to add and remove load port assemblies. While the present invention is described hereinafter with respect to a standard mechanical interface ("SMIF") system, it is understood that the present invention may be used with other wafer transport systems including open containers and bare cassettes. Moreover, while the present invention is described hereinafter with respect to semiconductor wafers, it is understood that the particular workpiece used is not critical to the present invention and other workpieces such as reticles and flat panel displays may be used in alternative embodiments. As used herein, the terms "semiconductor wafer" and "wafer" refer to a wafer at any stage during semiconductor fabrication process. It is further understood that the principles of the present invention, including a processing tool having modularized sections, may be used with other standalone processing tools within a wafer fab such as for example at the front end of processing tools for forming integrated circuits on wafers or within workpiece stockers for storing workpieces.

Referring now to FIGS. 1–4, there is shown a modular sorter 100 including two-wide modular section 102a, a wafer handling robot 104, a pair of aligners 106, a controller 108 and a graphical user interface (GUI) 110. The modular section 102a includes a pair of side-by-side load port assemblies 112. The assemblies 112 are identical to each other in a preferred embodiment, and while only one assembly 112 will be described hereinafter, the following description applies to each of the load port assemblies. However, it is understood that in alternative embodiments, the load port assemblies need not be identical to each other.

Each load port assembly 112 is capable of receiving a SMIF pod (not shown), and separating the SMIF pod shell from the SMIF pod door to allow access to cassette 20 (FIG. 4) carrying one or more wafers 22. In the embodiment of the load port shown in FIGS. 1–4, a SMIF pod is received on the load port assembly 112 so that a door of the SMIF pod seats on an inner support plate 114 (FIG. 2) and the pod shell seats on an outer support plate 116. Once positioned on the load port assembly, the port door is separated from the pod top by means of a latch mechanism 118 provided substantially beneath the inner support plate 114. Although not critical to the present invention, details related to such a latch mechanism are described in U.S. Pat. No. 4,995,430 entitled "SEALABLE TRANSPORTABLE CONTAINER HAVING IMPROVED LATCH MECHANISM", which patent is assigned to the owner of the present application and is incorporated by reference in its entirety herein. Although not shown, the outer support plate 116 may include retainng clips for securing the pod top on the outer support plate 116. Once separated, the outer support plate 116 with the pod top supported thereon, may be lifted up away from the inner support plate 114 by means of a lift mechanism (not shown) within the load port assembly 112. Further details relating to the load port assembly 112 are disclosed in U.S. patent application Ser. No. 08/730,643 entitled "LOAD PORT OPENER", which application is assigned to the owner of the present application and is incorporated by reference in its entirety herein.

The load port assembly 112 described above offers the advantage that it is compact, and it frees up space below the load port assembly for components such as the controller 108. However, the type of load port assembly 112 used on modular section 102a is not critical to the present invention and other load port assemblies are contemplated with controller 108 located beneath the load port assembly or elsewhere. Moreover, it is understood that while a load port assembly operating with bottom opening pods is disclosed, front opening load port interfaces which operate with front opening unified pods (FOUPs) may be used.

Figure 4:
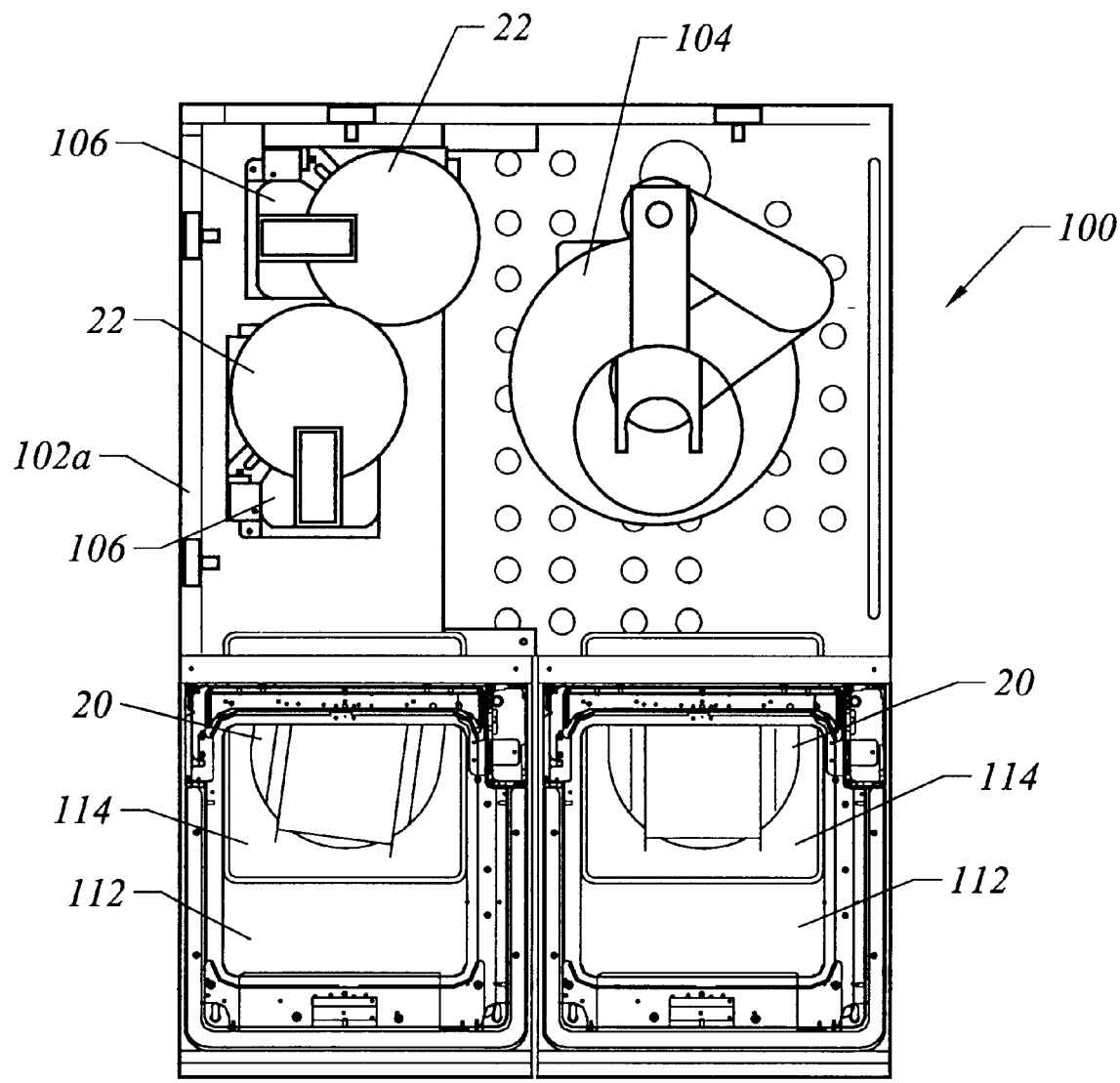
FIG. 4 is a cross-sectional top view of a two-wide modular sorter according to the present invention showing a position of the cassettes after advancing into the modular sorter.

As is shown for example in FIG. 4, the inner support plate 114 supporting the pod door and wafer cassette may be mounted for translation and rotation so that after the pod shell is separated from the pod door, the inner support plate 114 may translate into the interior of sorter 100 and then the inner support plate 114 positioned to the side of the robot 104 may rotate toward the robot. As is known to those of skill in the art, plate 114 may be mounted on a combination of linear and/or rotational drives to effect the necessary translation and rotation of plate 114 and the wafer-carrying cassette 20 seated thereon.

Referring now to the wafer handling robot 104 shown in FIGS. 1–4, in a preferred embodiment robot 104 includes a central mast (hidden from view) mounted in a base 120 for translation along a vertical axis. A proximal link 122 is rotatably mounted to an upper end of the mast, and a distal link 124 is rotationally mounted to the opposite end of the proximal link. The robot 104 further includes an end effector 126 pivotally attached to the distal link for supporting and transferring the wafers. In a preferred embodiment, end effector 126 comprises a dual platform mechanism, wherein each platform is capable of rotating with respect to the distal link 124 and with respect to each other. The two platforms allow wafers to be transferred between both aligners 106 and both cassettes in modular section 102a simultaneously to perform parallel wafer processing. Further details related to the dual platform end effector 126 and the parallel processing of wafers are disclosed in U.S. patent application Ser. No. 09/547,551, enitited "SYSTEM FOR PARALLEL PROCESSING OF WORKPIECES", previously incorporated by reference.

In alternative embodiments, it is understood that robot 104 may comprise a conventional, single platform end effector robot. An example of one such robot is disclosed in U.S. patent application Ser. No. 09/483,625 entitled "WORKPIECE HANDLING ROBOT", which application is assigned to the owner of the present application and is incorporated by reference in its entirety herein.

Robot 104 is positioned within modular section 102a in such a way to provide a minimal footprint of modular section 102a, while still allowing the robot 104 to transfer wafers to and from both load ports 112 in modular section 102a, as well as to and from a third load port assembly 112c attached to modular section 102a as shown for example in FIG. 12 and as described hereinafter.

One design feature allowing a reduction in the footprint of modular section 102a is the use of a so-called "path planning" algorithm to control the movement of robot 104. In particular, some prior art robot control algorithms first rotate the robot arm to the desired orientation, and after rotation, extend the end effector along a straight line radially out from a rotational axis of the robot to the desired position. As wafers 22 must be removed straight out from and inserted straight into a wafer cassette 20 (to avoid contact with the sides of the cassette), robots employing straight line algorithms had to be moved directly in front of a cassette in order to transfer a wafer straight out of or into the cassette. It is known to mount a robot on a horizontal drive track to accomplish this.

However, where a robot is located directly in front of a load port assembly, the sides of the enclosure must be moved outward a greater amount than that required for the width of the load port assembly alone. This is true because the robot links 122 and 124 require sufficient clearance to maneuver, which required clearance is greater than the space needed for the load port assembly alone.

In accordance with the present invention, through the use of the path planning algorithm, the robot 104 is able to move in an X-Y cartesian plane, and in particular straight into and out of a cassette on a load port assembly 112, without being located directly in front of the load port assembly 112. This is accomplished by coordinating the radius, R, of the end effector (i.e., the distance of the end effector from the axis of rotation of the robot) with the angle, θ, of the robot (i.e., the rotational position of the robot arms with respect to a reference axis). In particular, by coordinating robot motion so that the proximal link rotates at the same time as the end effector translates, the end of the end effector can be controlled to move in a straight line that does not pass through the axis of rotation of the robot.

Accordingly, the robot 104 may be positioned inward from the sides of the modular section 102a, thereby providing ample room for the robot links to maneuver. As additional room at the sides of the modular section 102a for robot maneuverability is not required, the footprint of the modular section 102a may be dictated entirely by the minimum dimensions mandated by Semiconductor Equipment and Materials International ("SEMI") standards for side-by-side load port assemblies. Such a minimal footprint provides significant space saving advantages within the wafer fab where space is at a premium.

Figure 12:
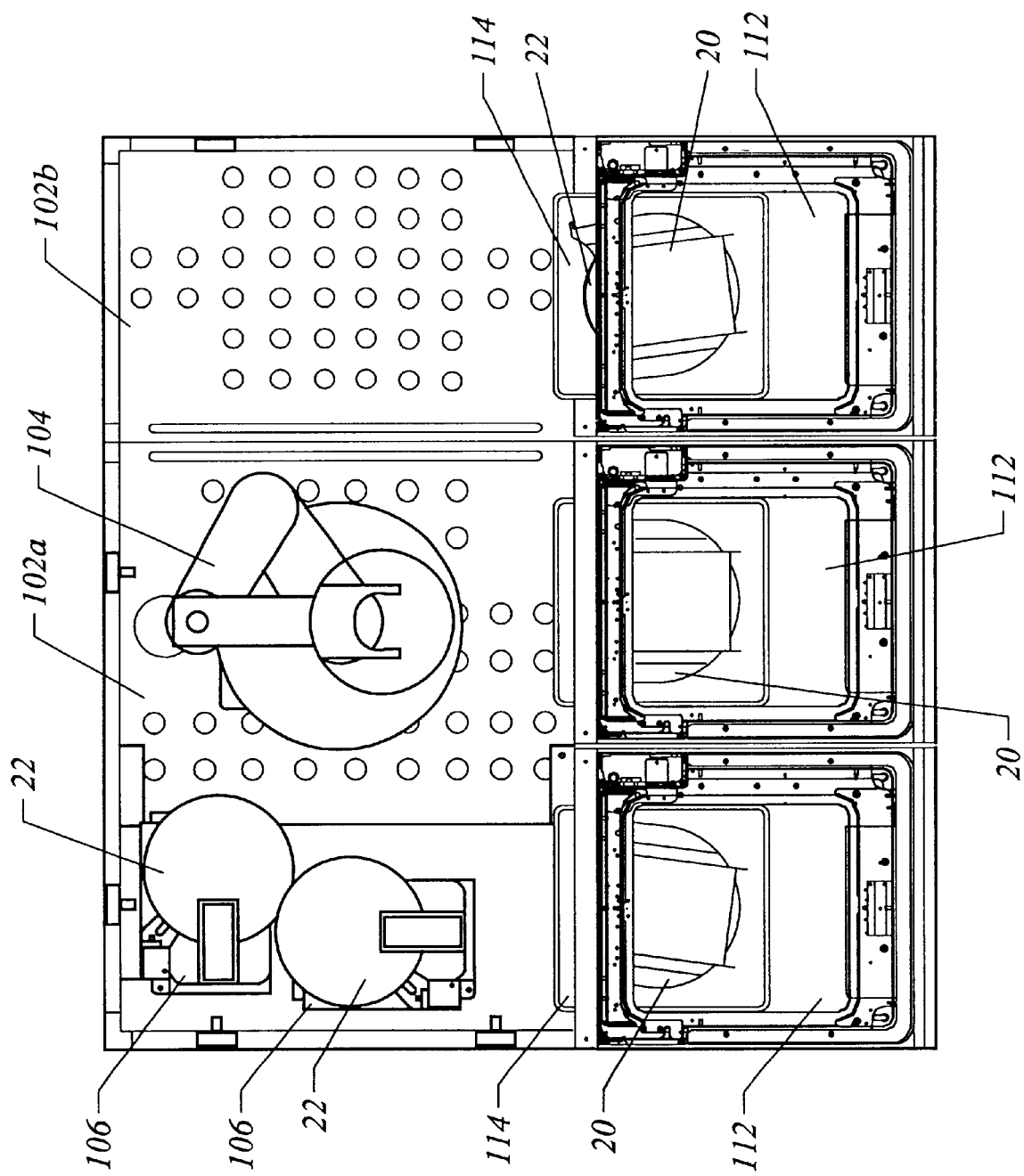
FIG. 12 is a cross-sectional top view of a three-wide modular sorter according to the present invention showing a position of the cassettes after advancing into the modular sorter.

As explained in greater detail below, robot 104 also transfers wafers to and from a third load port assembly 112c located on an additional modular section 102 affixed to the first modular section as shown in FIG. 12. Therefore, in a preferred embodiment, robot 104 is located within the modular section 102a between the two load port assemblies 112, but closer to the assembly 112b. Thus, upon the addition of another modular section as shown for example in FIG. 12, the robot 104 may access wafers from the cassettes seated on each of the load port assemblies 112a, 112b and 112c. For load port assemblies 112a and 112c, tilting the inner support plate 114 inward toward the robot 104 as described above further facilitates wafer transfer into and out of the wafer cassettes thereon. As the robot 104 is located closer to load port assembly 112a than 112c, the inner support plate on load port assembly 112c may tilt inward to a greater degree than inner support plate 114 on load port assembly 112a.

Referring now to aligners 106, they are provided for determining a center and radial runout of the wafers 22, locating the position of a notch or other fiduciary mark on the wafers, and then reading an OCR or other identifying mark provided on each wafer. The aligners 106 are preferably identical to each other, and only one such aligner 106 is described hereinafter. It is understood that the following description applies to both aligners. Aligner 106 preferably includes a chuck 130 rotationally mounted within a base 132. Once a wafer 22 is deposited on chuck 130, the chuck rotates the wafer to identify the location of the notch and to determine the radial runout. A sensor 136 of known construction is provided for both identifying notch location and radial runout. Once the position of the notch has been identified, the wafer is rotated to position the OCR mark under a video camera 134 so that the camera can read the OCR mark. The wafer may then be reacquired by the end effector on center, and returned to a cassette 20.

In a preferred embodiment of the present invention, each aligner 106 preferably further includes a buffer paddle 138 upon which wafers maybe buffered to increase throughput of the aligners and system in general. The buffer paddle 138 on each aligner allows the robot to bring a second wafer to the aligner while a first wafer is being processed, and then allows the robot to carry the first wafer away from the aligner while the second wafer is being processed. Thus, the aligner does not side idle while the robot transfers wafers to and from the aligner and the robot does not sit idle while the aligner performs its operations. Further details relating to an aligner including a buffer paddle are disclosed in U.S. patent application Ser. No. 09/452,059, entitled "WAFER ORIENTING AND READING MECHANISM", which application has previously been incorporated by reference. The dual platform end effector and parallel processing, together with buffer paddles 138, allow four wafers to be processed simultaneously thus significantly improving the throughput of the sorter 100 relative to conventional sorters. It is understood that the buffer paddle 138 may be omitted from each aligner 106 in alternative embodiments of the invention. Moreover, it is understood that sorter 100 may include only a single aligner 106 in alternative embodiments.

Controller 108 includes electronics and power components for controlling each of the modular sections of the sorter 100 in its various configurations, as well as the overall operation coordination of the components of the sorter 100. Controller 108 further provides operator feedback and information over GUI 110. In a preferred embodiment, controller 108 may be located beneath the load port assemblies 102. However, it is understood that the controller 108 may be located to a side, behind or remotely from the sorter 100 in alternative embodiments. For example, when the sorter 100 is backed against a wall, the controller may be provided below the load port assemblies as shown for example in FIG. 9. The controller may be affixed to the sorter by a pair of pins 109 extending from the sorter. In order to perform maintenance, one or both pins 109 may be simply removed and the controller swung away from the sorter to allow access thereto. It is understood that the controller may be mounted to the sorter by other mechanisms. Moreover, where the sorter is provided in a tool bay have a bay and chase, the controller may be seated in the chase behind the sorter where space is not as critical. The ability to locate the controller 108 at different locations depending on the environment in which the sorter is used adds a level of flexibility not found in conventional systems.

Moreover, as all of the electronics and power components have been centralized in an easily accessible housing, maintenance, upgrade and/or replacement of the components within controller 108 is made significantly easier than in conventional wafer sorter controllers.

Controller 108 includes a plurality of power and signal ports so that when a new modular section 102 is added, power and signal connections from the new section may be simply connected to the appropriate controller ports. Once additional modular section(s) 102 have been added as described hereinafter, a technician can reconfigure the controller via GUI 110 to coordinate the operation of the new modular section(s) with existing modular section(s) as well as the robot 104 and aligners 106. It is also contemplated in an alternative embodiment that each modular section is essentially a "plug and play" component. In such alternative embodiments, the controller includes software for recognizing the new modular section and thereafter coordinating the operation of the new modular section with existing modular section(s) as well as the robot 104 and aligners 106. As indicated above, removing the power and signal components from the interior of the sorter and combining them in a single centralized controller 108 further facilitates ease of maintenance, upgrade and/or replacement of components within sorter 100.

Figure 2:
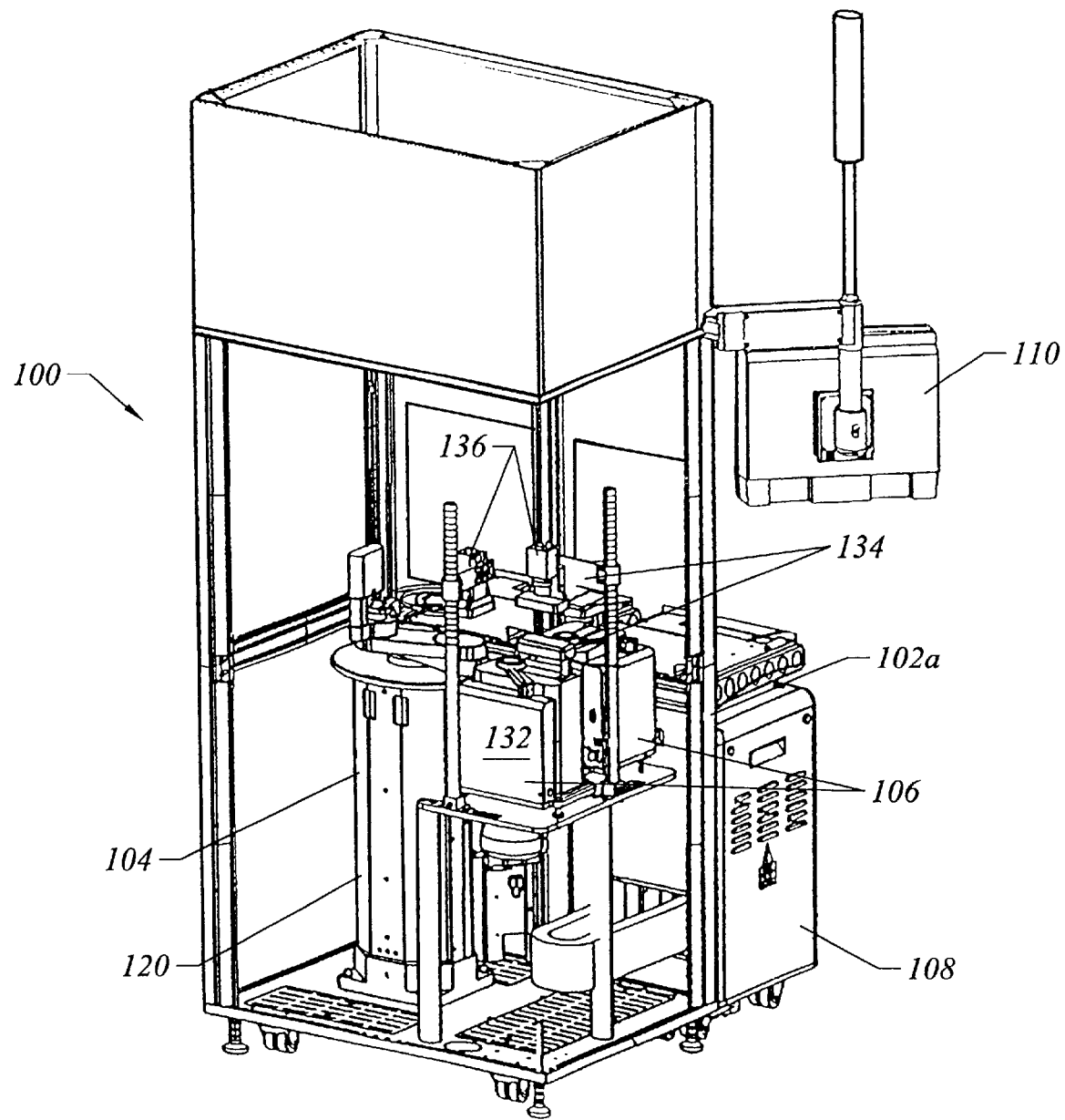
FIG. 2 is a rear perspective view of a modular sorter with a portion of the frame cut away.
Figure 3:
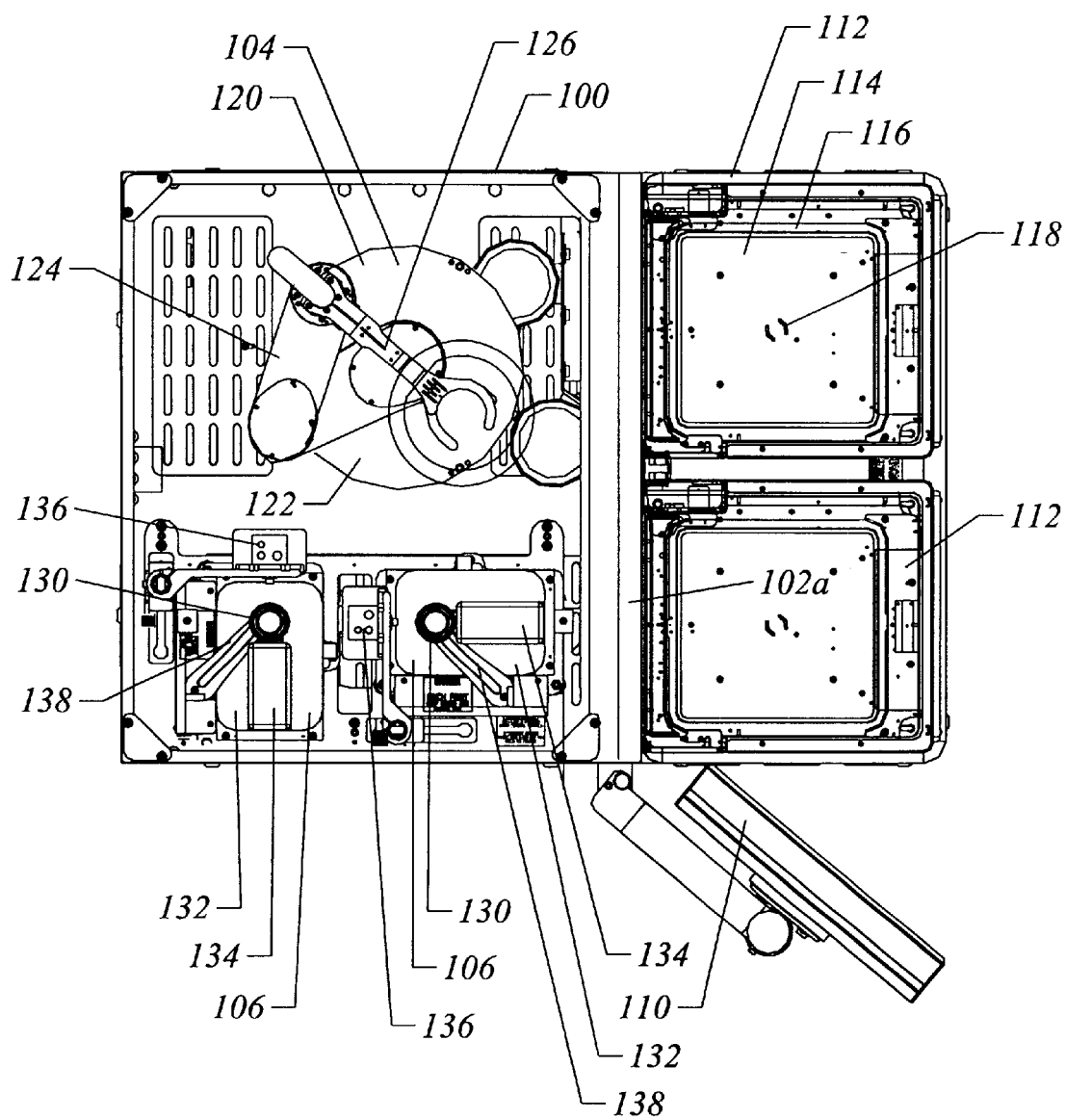
FIG. 3 is a cross-sectional top view of a two-wide modular sorter.

In addition to the path planning algorithm for operating robot 104, the relative positioning of the robot and aligner further allows the sorter 100 according to the present invention to occupy a minimum footprint. In particular, as indicated by FIG. 2, the upper surfaces of the respective aligners are below the lowest elevation of a wafer within the cassette 20 on load port assembly 112. Therefore, the aligners 106 may be located near robot 104 without interfering with the robot transfer of wafers to and from the cassettes on the respective load ports.

Figure 9:
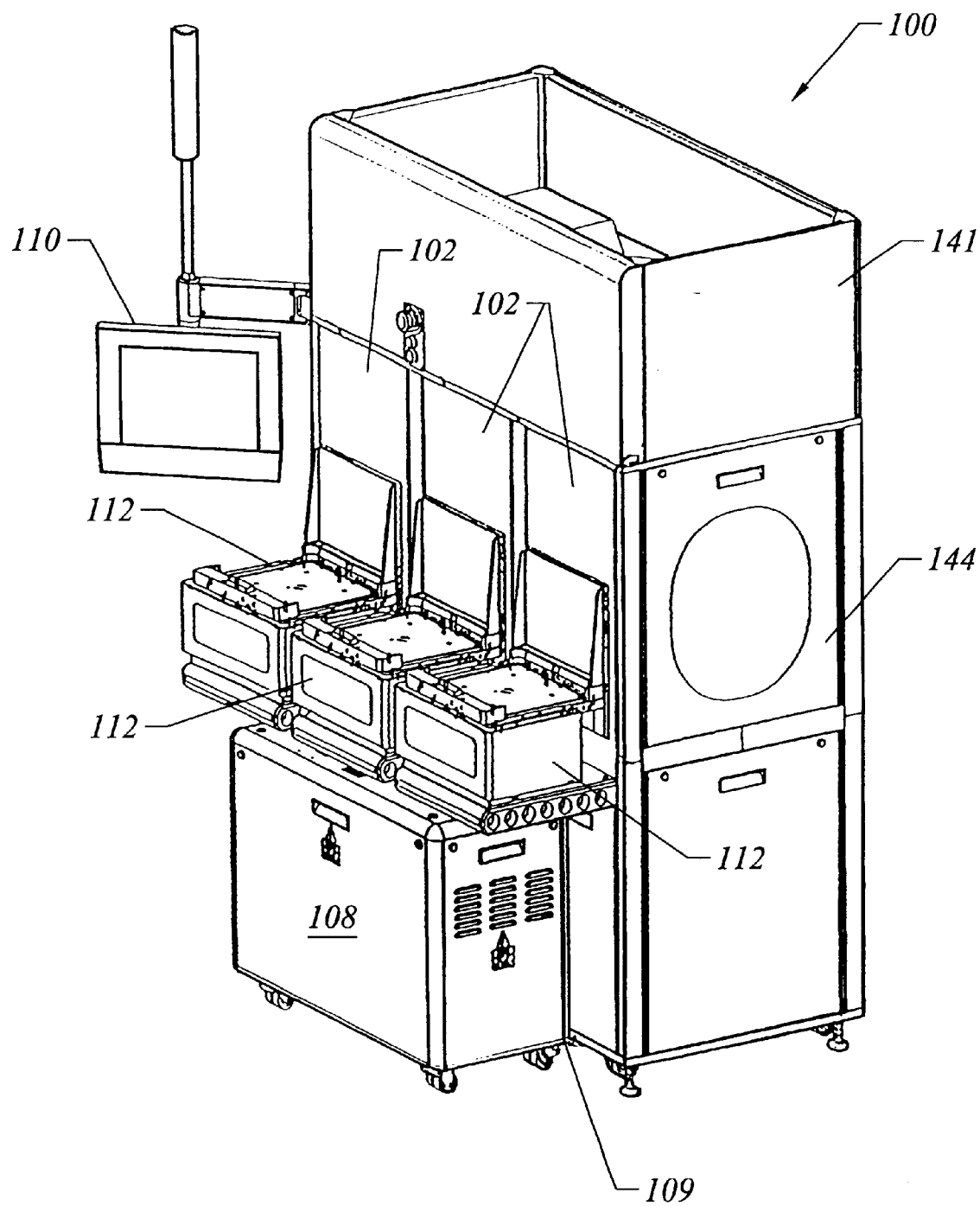
FIG. 9 is a front perspective view of a three-wide modular sorter according to the present invention.
Figure 10:
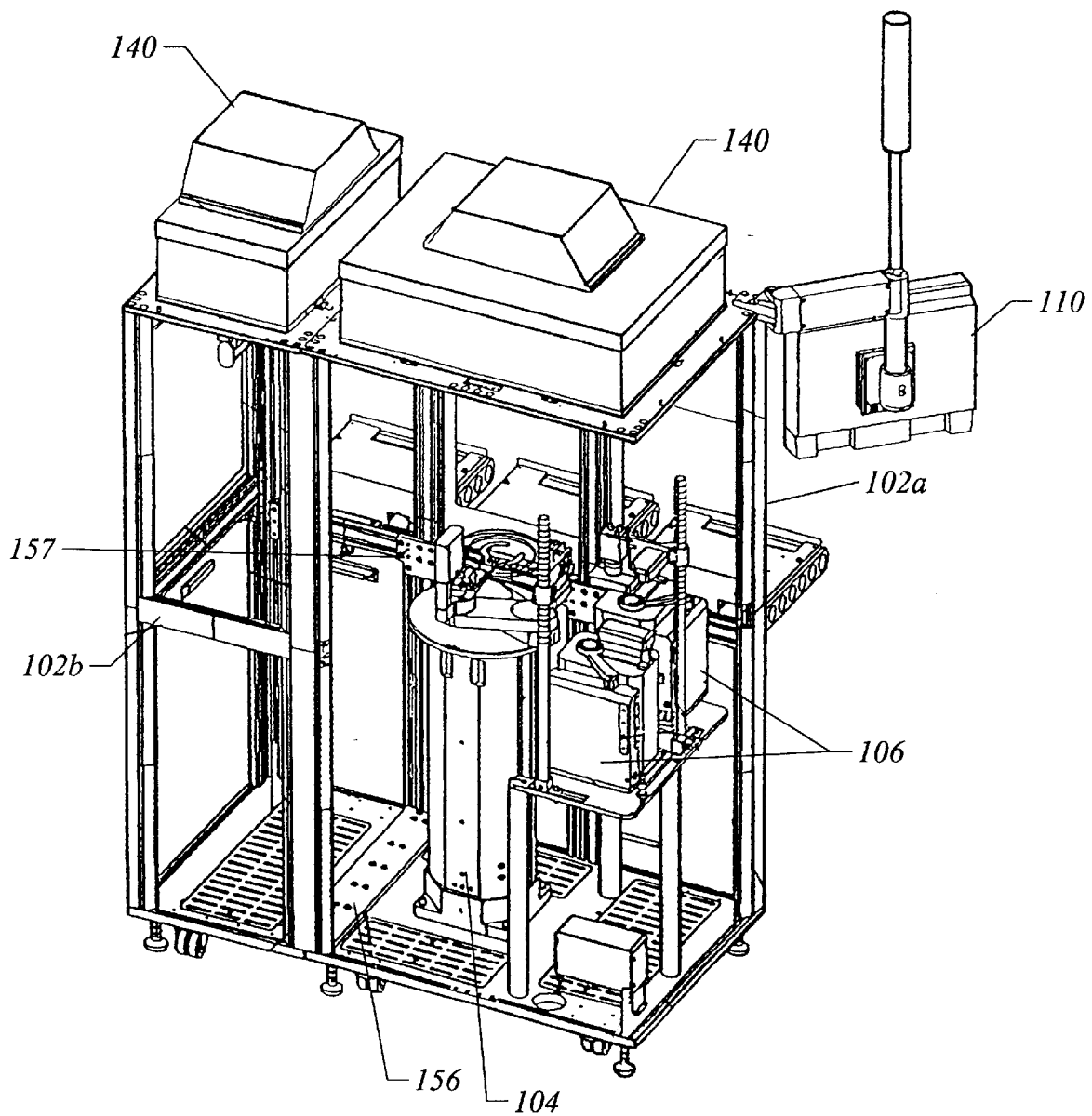
FIG. 10 is a rear cut away perspective view of a three-wide modular sorter according to the present invention.

The two-wide sorter 100 shown in FIGS. 1–4 preferably further includes a fan and filtration unit 140 shown in its position above the modular sections in for example FIG. 10. The fan and filtration unit may be provided for circulating a fluid and filtering out particles and contaminants. The fluid may be clean air, nitrogen or other fluids for removing contaminants and for deionizing the interior of the sorter. As also shown in FIG. 10, each additional modular section 102 added to the sorter 100 preferably includes its own fan and filtration unit 140 which is controlled by controller 108 upon connection of the additional section to the sorter 100 as described above. In alternative embodiments, it is understood that the additional fan and filtration units on the added modular sections 102 may be omitted so that the fan and filtration unit 140 provided on modular section 102a services all of the modular sections. As seen in FIGS. 1 and 9 for example, a fan and filtration unit cover 141 may be provided for aesthetics to cover the fan and filtration unit 140. The cover 141 may vary in size depending on the configuration of sorter 100. As shown for example in FIG. 6, a modular section 102 may further include an ionizer 143 mounted at the top of the unit for dissipating static electricity within the sections 102. Although omitted from most drawings, it is understood that each section 102 may include an ionizer 143 as shown in section 102b in FIG. 6.

As indicated above, in certain applications, three-wide and four-wide wafer sorters are required. In accordance with the present invention the two-wide modular section sorter 100 shown in FIGS. 1–4 may be easily modified to include additional modular sections having additional load port assemblies. In particular, referring now to FIG. 5, there is shown a frame 142 of the modular sorter 100 shown in FIGS. 1–4, which frame includes a removable end panel 144. In a preferred embodiment, panel 144 may include a flange (not shown) along a lower portion of the panel, which flange fits within a track 145 in a base of the frame 142. The top of the end panel 144 may include a pair of turn keys 147 which include fingers (not shown on a back side of the panel 144, which fingers mate within slots (not shown) on a top portion 150 of frame 142. Thus, to mount the removable panel on the frame 142, the lower flange on the panel may be seated within track 145, and then the respective turn keys 147 may be rotated to rotate the fingers into position within the slots in the top portion 150 to secure the panel on the end of frame 142. To remove the panel from the frame 142, the turn keys 147 may be rotated and the panel removed.

Figure 5:
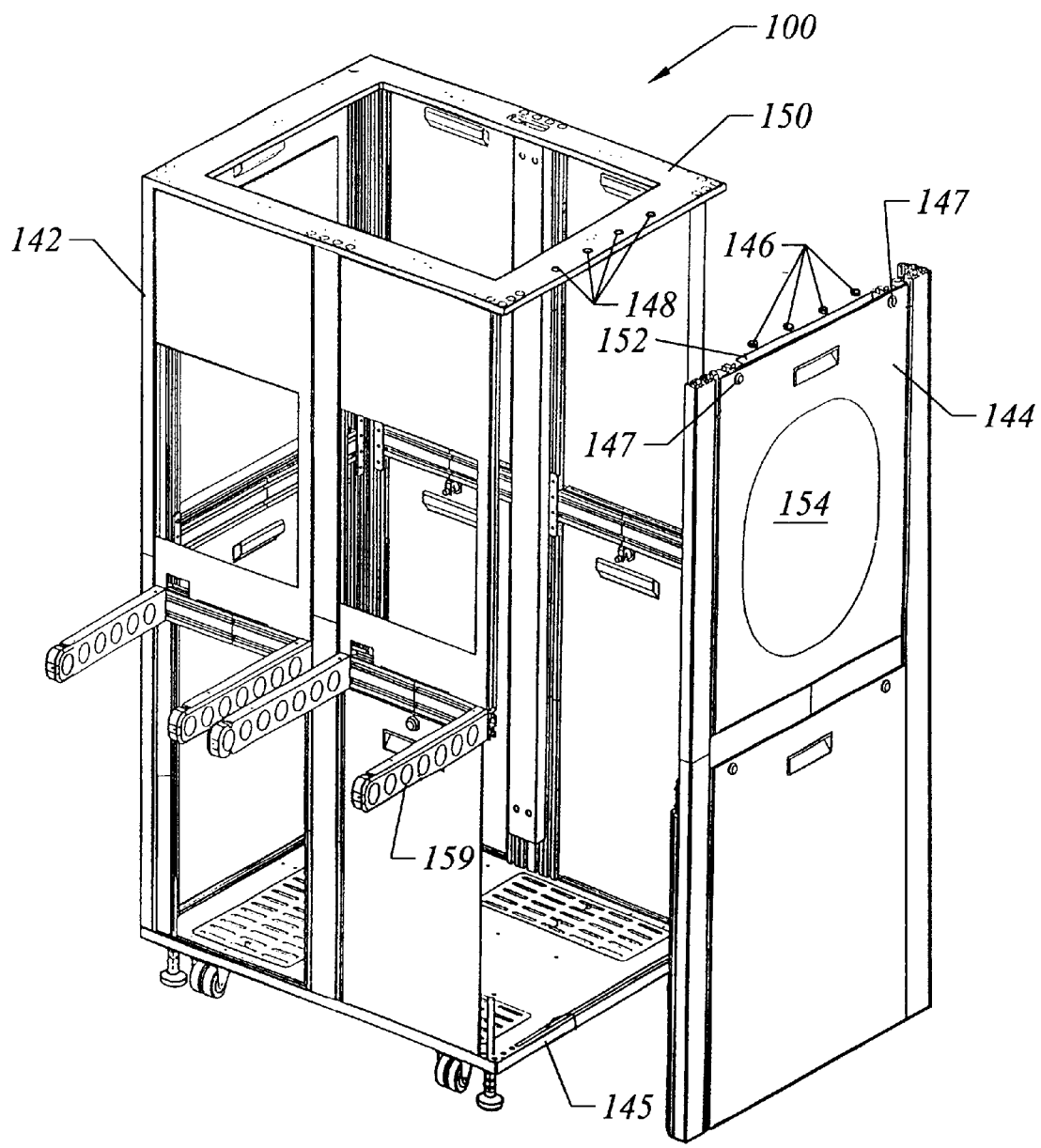
FIG. 5 is a front perspective view of the frame of a two-wide modular sorter with the end panel removed.

It is understood that the panel 144 may be removably mounted to the end of frame 142 with other fastening schemes. For example, as is also shown in FIG. 5, the panel 144 may be affixed to frame 142 by bolts 146 fitting down through holes 148 in atop portion 150 of frame 142 into a flange 152 formed on end panel 144. A similar fastening arrangement including bolts 146 fitting through holes in a lower portion of frame 142 may be used to affix the bottom portion of end panel 144 to the frame 142. (Although FIG. 5 shown both the turn keys 147 and bolts 146, it is understood that an embodiment would may include one or the other fastening system). As would be appreciated by those of skill in the art, other known fastening schemes may be employed for removably coupling end panel 144 to the frame 142.

While end panel 144 preferably mounts snugly to the frame 142, it is not necessary that an air tight seal be provided, as the fan and filtration unit 140 creates a higher pressure within the sorter 100 than the surrounding environment so that contaminants from the surrounding environment are prevented from flowing into the sorter through any seams between the front, rear and end panels of the sorter. End panel 144 preferably further includes a window 154 for allowing viewing of the operations within sorter 100.

When it is desired to add additional modular sections to the sorter 100, the first step is to remove end panel 144, which may be easily accomplished by rotating the turn keys 147 or by removing the bolts 146. (While FIG. 5 shows the panel 144 being removed with all the working components from within sorter 100 being omitted, it is understood that the panel 144 may be removed while all the components of sorter 100 remain in place within and/or affixed to the sorter 100).

Figure 6:
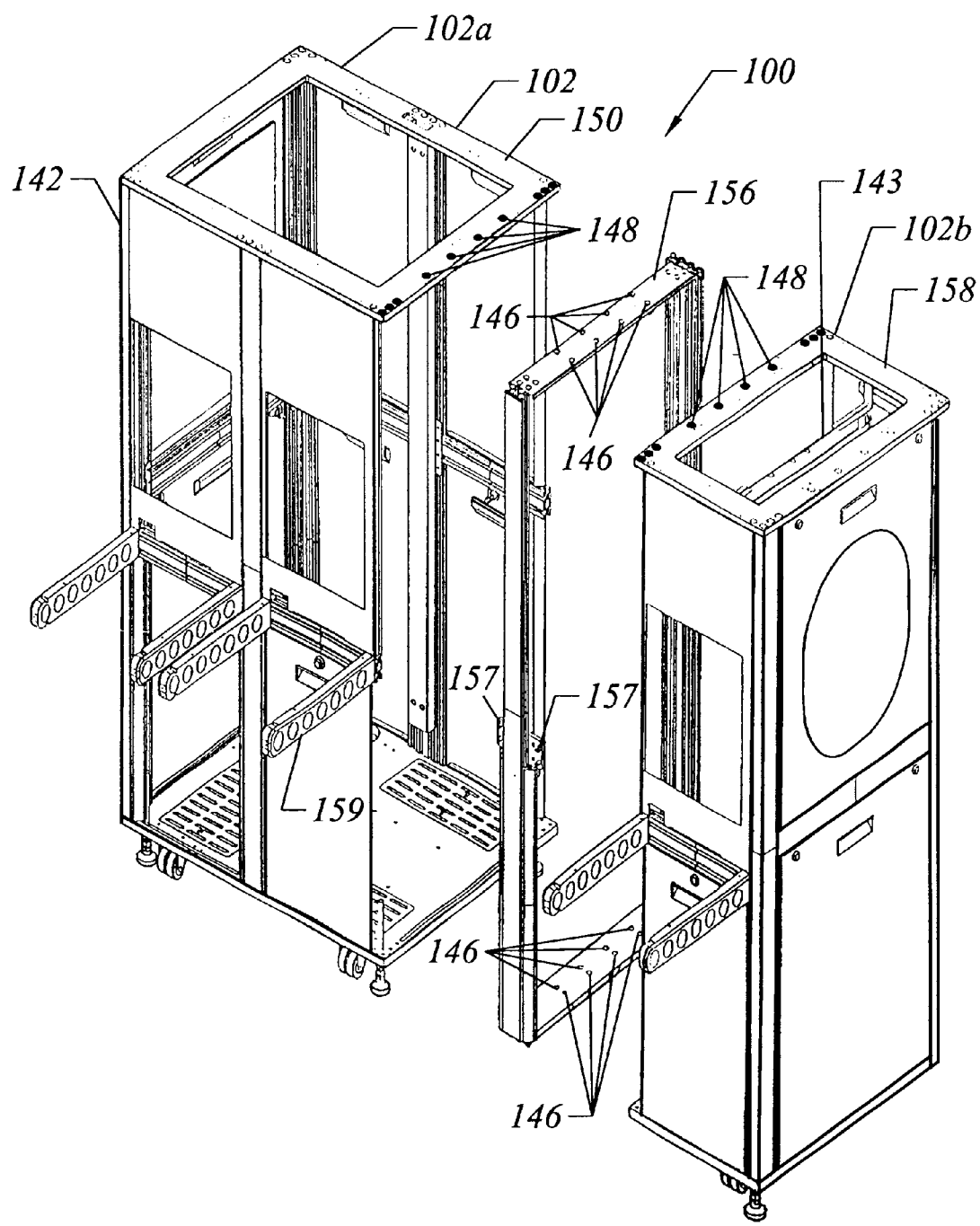
FIG. 6 is a perspective view of a frame of the modular sorter showing a single modular section being affixed to a first modular section via a connector frame.
Figures 7, 8:
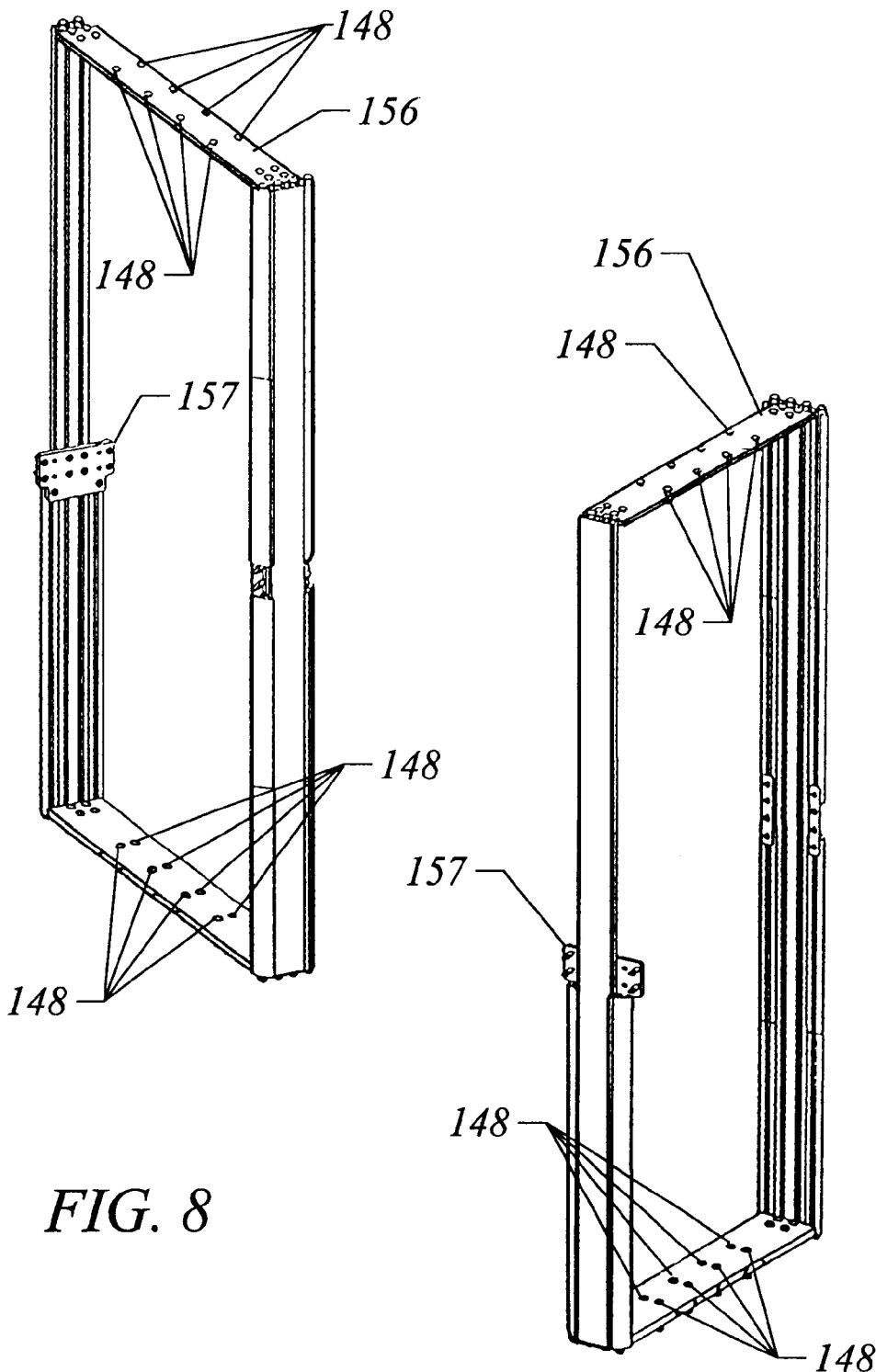
FIGS. 7 and 8 are front and rear perspective views of the connector frame according to the present invention.

Referring now to FIG. 6, once the end panel 144 is removed, a connector frame 156 is affixed to the frame 142 in the same position and in the same manner as the removed panel 144. As shown in FIGS. 7 and 8, connector frame 156 is a generally rectangular frame approximately four inches wide, and attaches to frame 142 so that a portion of the connector frame 156 protrudes out away from frame 142. A new modular section 102b may be added by affixing the frame 148 of the new modular section 102b to the portion of the connector frame 156 protruding from frame 142. (Again, while the new modular section 102b is shown only with its frame 158, the new modular section maybe affixed with its load port assembly 112 and other components affixed thereto.) The connector frame 156 may include a set of bolts 146 which mount within holes 148 at the top and bottom of frame 158.

The connector frame 156 may additionally include a stiffening brace 157 midway up its length at the height of the load port assemblies which attaches to both modular sections 102a and 102b to add additional rigidity to the frame and to prevent the horizontal extrusions 159 on which the load port assemblies sit from tilting under the weight of the load port assemblies. It is understood that other known fastening schemes may be used to affix additional modular sections 102 onto the sorter 100. For example, instead of connector frame 156 and the new modular section 102b being separate components, they may be formed integrally together and attach to the frame 142 as described above as a single unit.

With the attachment of the additional modular section 102b, sorter 100 may comprise a three-wide unit as shown in FIGS. 9–12. Once the additional modular section is affixed, power and control connections from the additional section plug into the controller 108. The controller may then be configured via GUI 110 so that the controller recognizes the addition of the new section 102b, and changes the overall operation scheme to now operate as a three-wide sorter. The operation of the three-wide sorter shown in FIGS. 9–12 is substantially the same as the operation of the two-wide sorter shown in FIGS. 1–4, with the exception that wafers are transferred to and from each of the three cassettes 20 at the respective load ports.

Figure 11:
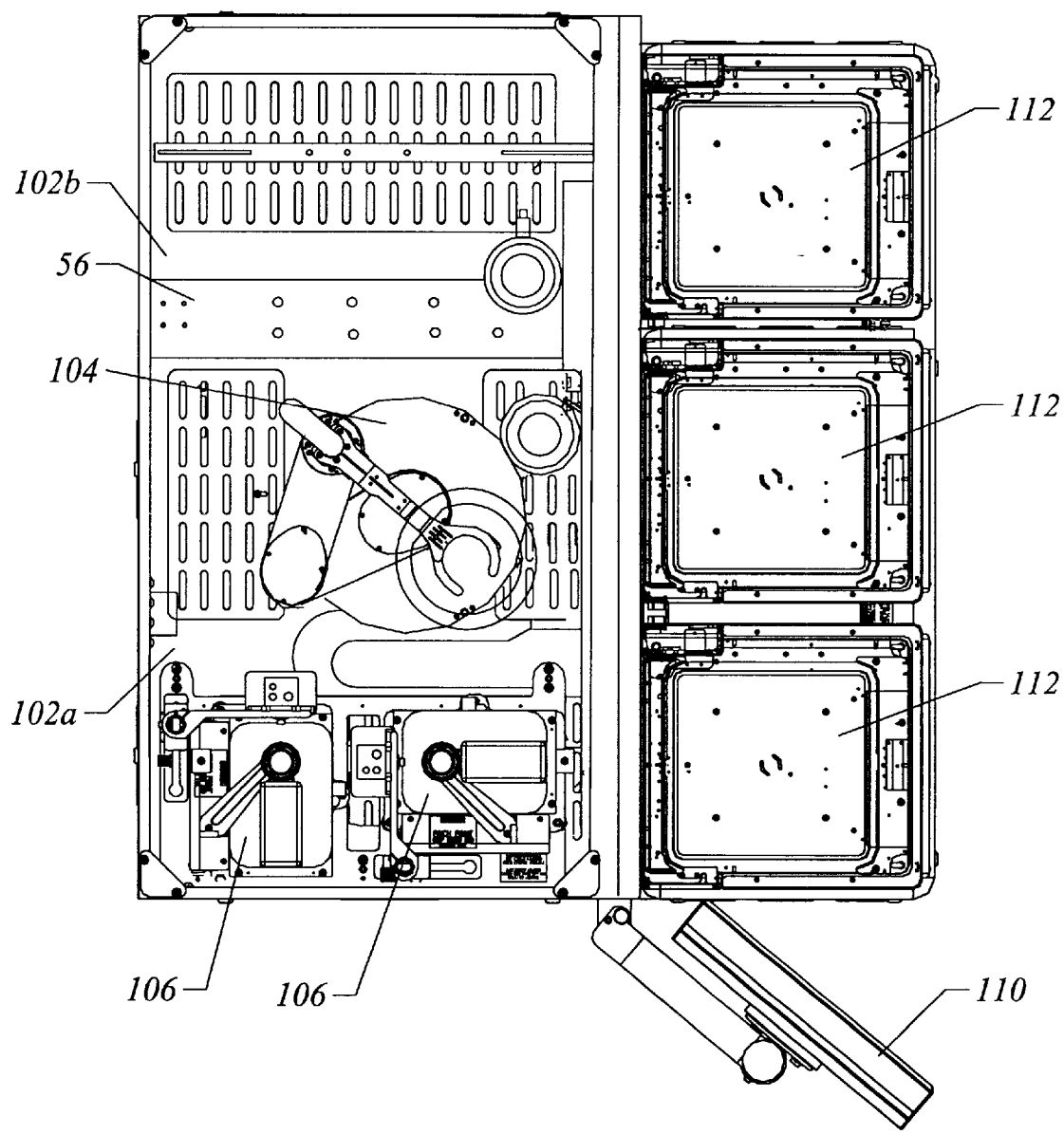
FIG. 11 is a cross-sectional top view of a three-wide modular sorter according to the present invention.

As indicated above and as shown specifically in FIGS. 10–12, with the addition of the new modular section 102b, the robot 104 is able to transfer wafers to and from the cassettes at each of the three load port assemblies. As seen specifically in FIG. 12, the inner support plate 114 of each load port assembly preferably translates into the sorter 100, and at least the inner support plates 114 of the load port assemblies 112a and 112c are rotationally mounted so as to additionally rotate toward the robot.

Figure 13:
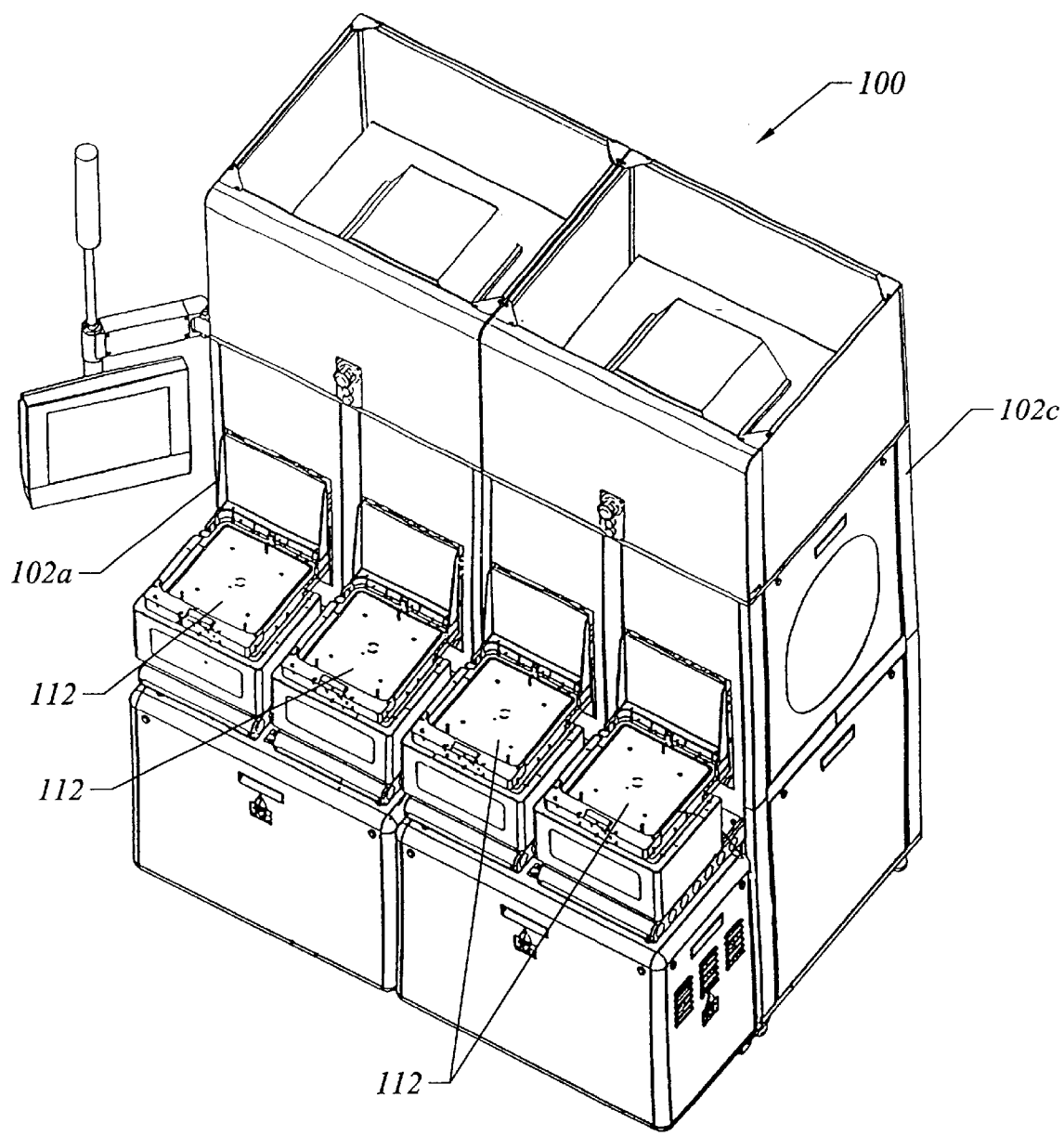
FIG. 13 is a front perspective view of a four-wide modular sorter according to the present invention.
Figure 14:
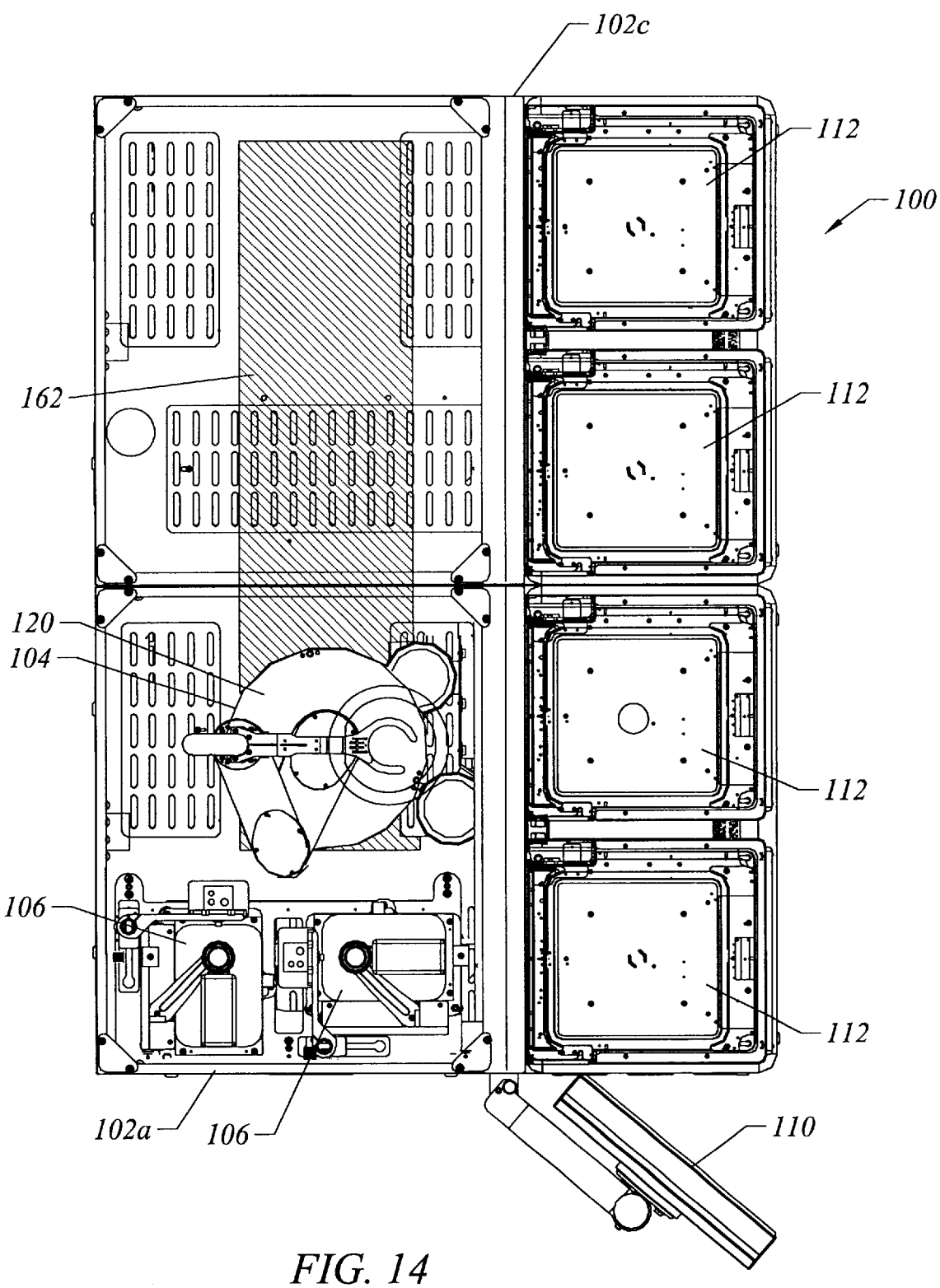
FIG. 14 is a top cross-sectional view of a four-wide modular sorter showing a wafer handling robot mounted on a track.
Figure 15:
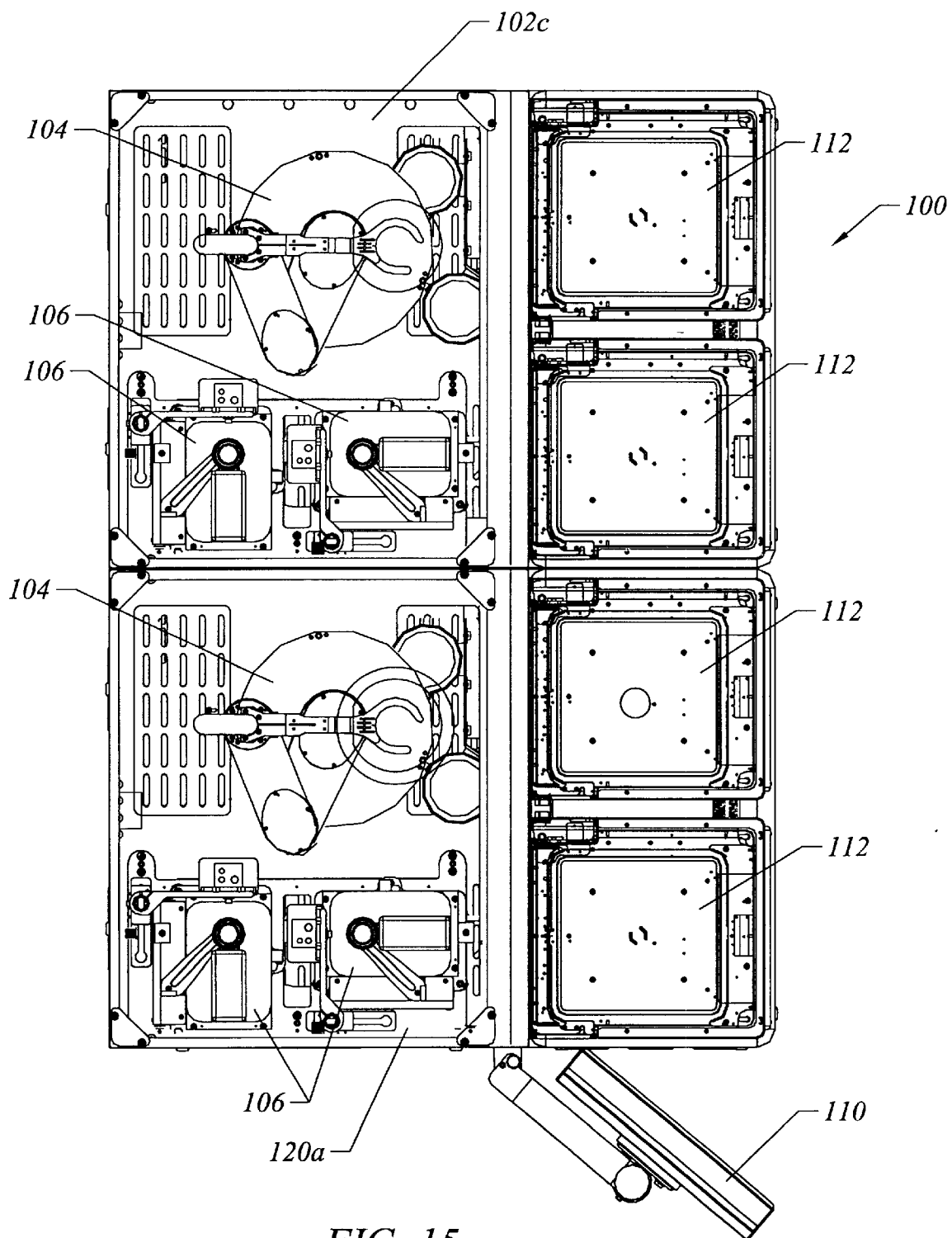
FIG. 15 is a top cross-sectional view of a four-wide modular sorter including a pair of wafer handling robots and two pairs of aligners.

According to a further embodiment of the present invention, upon removal of the end plate 144 and the addition of connector frame 156 described above, the two-wide modular sorter shown in FIGS. 1–4 may be converted to a four-wide modular sorter as shown for example in FIGS. 13–15. It is understood that a four-wide sorter 100 may be formed of differing combinations of modular sections 102. A preferred embodiment of a four-wide modular sorter 100 is shown in FIG. 14. In this embodiment, a two-wide modular section 102c is affixed to the two-wide modular section 102a shown in FIGS. 1–4 using the connector frame 156 as described above.

In the embodiment of FIG. 14, a stationarily mounted robot 104 may be unable to transfer wafers to or from the load port assembly 112 most distal from the robot 104. As such, instead of robot 104 having its base 120 stationarily mounted to a floor of the modular sorter, the robot 104 is instead preferably mounted to a horizontal drive unit 162 shown schematically in FIG. 14. Such horizontal drive units 162 are well known in the art. An embodiment of one such drive unit 162 includes a carriage to which the base 120 of robot 104 is mounted, which carriage is in turn mounted on tracks spanning modular section 102c and at least a portion of modular section 102a. The carriage may be translated by a linear drive or the like controlled by controller 108.

In certain embodiments using for example larger workpieces, it may not be possible to provide a three-wide sorter and have a stationary robot reach all of the load port assemblies and work stations within the sorter. For these embodiments, upon configuration of an additional one-wide modular section 102b to the two wide modular section 102a, it is contemplated that a horizontal drive unit 162 as described above be used to maneuver robot 104 as necessary to accomplish workpiece transfer.

It is understood that instead of a two-wide modular section 102c, two separate one-wide modular sections 102b may be affixed together using two separate connector frames 156. Modular section 102b shown for example in FIG. 6 may include a removable end plate 144 as in modular section 102a to allow two single modular sections 102b to be affixed to each other.

Once the additional modular section 102c is affixed, power and control connections from the additional section 102c plug into the controller 108. The controller 108 is configured to recognize the addition of the new section, and changes the overall operation scheme to now operate as a four-wide sorter, including the control of robot translation by the horizontal drive unit 162.

A further alternative embodiment of a four-wide modular sorter 100 is shown in FIG. 15. This embodiment includes two, two-wide modular sections 102a and 102c affixed together via connector frame 156 as described above. In this embodiment, modular section 102c is preferably identical to modular section 102a (although not shown, the second modular section 102c may also include a GUI 110 mounted right side of the section with respect to the view shown in FIG. 15). The provision of two separate controllers allows the modular sections to be separated if desired and to operate independently of each other. However, it is understood that the four-wide unit shown in FIG. 15 may alternatively operate with a single controller 108. In this embodiment modular section 102c also includes a second robot 104. The two robots transfer wafers between the cassettes 20 at the four different load port assemblies 112. The robot 104 in section 102a is capable of transferring wafers between cassettes at the two load port assemblies in modular section 102a and the nearest load port assembly in modular section 102c. Similarly, the robot 104 in modular section 102c is capable of transferring wafers between the two load port assemblies in modular section 102c and the nearest load port assembly in modular section 102a. Alternatively, cassette shelves (not shown), open at both ends, may be mounted between the two modular sections, or over the aligners 106 within modular section 102c. In such an embodiment, the robot 104 in modular section 102a can transfer one or more wafers onto the shelves through the open end of the shelves nearest section 102a, and the robot 104 in modular section 102c can transfer the one or more wafers away from the shelves through the open end of the shelves nearest section 102c, or visa-versa. The shelves may alternatively or additionally be open at a front end of the shelves so that workpieces can be transferred to and from the shelves at the front end of the shelves by the respective robots.

Modular section 102c in this embodiment may further include one or two aligners 106 in addition to the one or two aligners 106 in modular section 102a. In such an embodiment, the robots 104 transfer wafers to the aligner(s) within their respective modular sections for the aligners to identify radial runout, locate notch position and read the OCR mark as described above.

In a preferred embodiment, each of the four-wide modular sorters 100 shown in FIGS. 13–15 maybe controlled by the single centralized controller 108 as described above. In the embodiment of FIG. 15 including a second robot 104 and potentially one or two additional aligners 106, as indicated above, there may a single or two separate controllers 108 which coordinate the operation of the two robots so as to allow wafer transfer between the two modular sections 102a and 102c without the robots interfering with each other. In embodiments including two controllers, control of the overall system may be performed in parallel between the controllers, or control may be handed off between the controllers. In this embodiment, the GUIs associated with each controller may indicate which controller has control at a give time of the system.

Up to this point, the sorter 100 has been described and shown as having two or more load port assemblies mounted along the same side of the sorter 100. However, in alternative embodiments, it is understood that one side of the sorter may include one or more load port assemblies and that the opposite side may include one or more additional load port assemblies. Such embodiments are shown in FIGS. 16–18.

Figure 16:
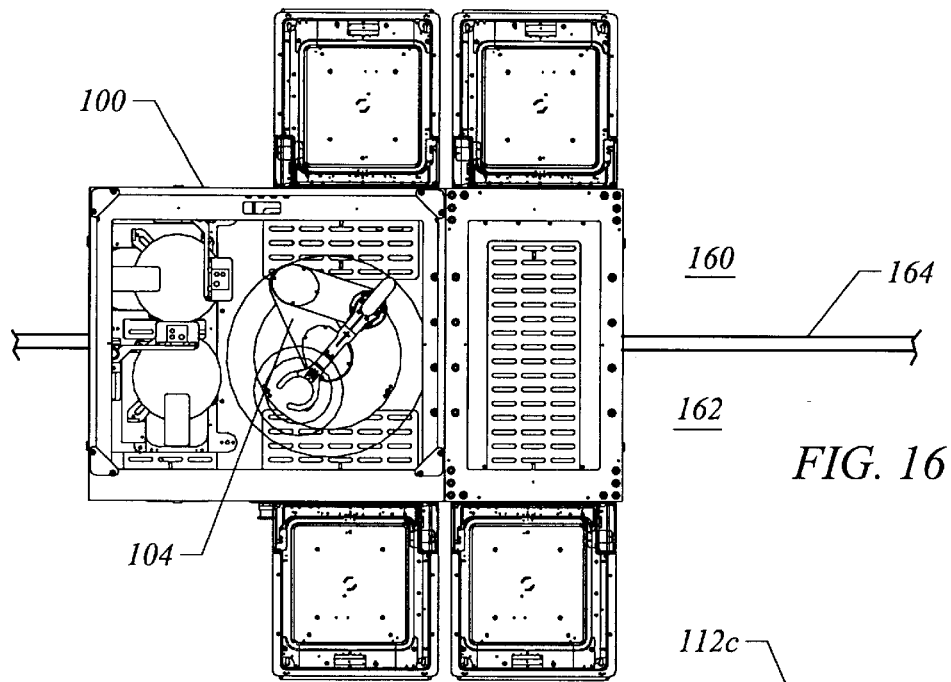
FIGS. 16 and 17 are top views of a sorter according to a further alternative embodiment including load port assemblies on opposite sides of the sorter.

With regard to FIG. 16, it is occasionally desirable to isolate one portion of a wafer fab from another portion. For example, one portion of the wafer fab may perform operations such as chemical mechanical polishing which are not performed within as high a cleanroom specification as other processes. According to the present invention, a sorter 100 can straddle the isolation boundary between two environments within a wafer fab, and allow wafer transfer between the two environments without the risk of contamination of the cleaner environment (in this embodiment, it is preferred that SMIF systems are used to ensure that the two environments remain isolated). Thus, in FIG. 16, workpieces from a first environment 160 may be transferred to a second environment 162, isolated from each other by a wall 164 without risk of contamination. Alternatively, load port assemblies may be provided on opposed sides of the sorter 100 owing to space considerations.

Figure 17:
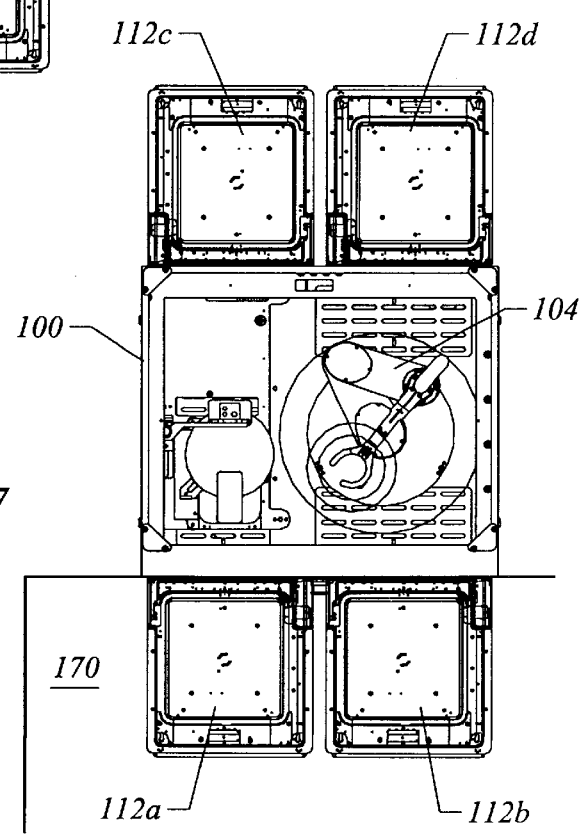
Figure 18:
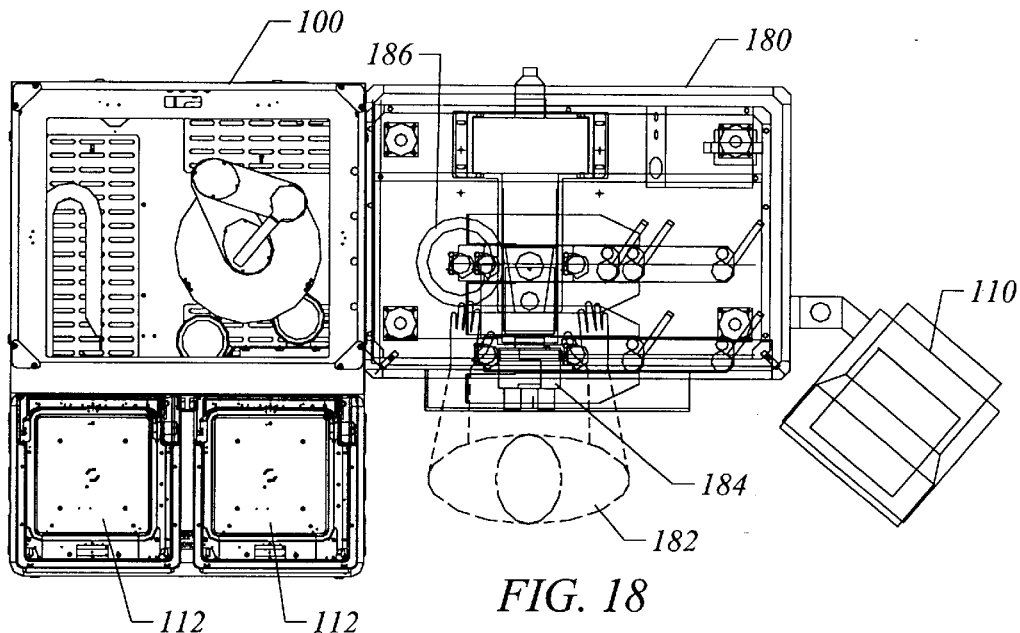
FIGS. 18 and 19 are top and front views, respectively of a sorter according to a further alternative embodiment including a work station adjacent to the sorter.

Additionally, as shown in FIG. 17, one side of the sorter 100 may be integrated into a stocker 170 (shown partially) in which workpiece-carrying containers are stored. In such an embodiment, the sorter 100 and stocker 170 may share a pair of load port assemblies 112a, 112b which act as interfaces between the sorter and stocker. A container handling apparatus is provided within the stocker 170 for transferring containers to the load port assemblies 112a and 112b. In this embodiment, workpieces may be transferred by robot 104 within sorter 100 solely between the containers loaded onto load ports 112a and 112b. Alternatively, a number of different containers may be loaded onto assemblies 112a and/or 112b (at different times if more than two containers) so that workpieces from each may be combined into a single container on either load port assembly 112c, 112d on the opposite side of the sorter. Conversely, workpieces from a single container on assembly 112a or 112b may be split between any number of containers brought to assemblies 112c and 112d across the sorter. It is also contemplated that workpieces may be transferred to one or more containers on load port assemblies 112a and 112b from containers brought to the sorter on assemblies 112c and 112d.

It is understood that the embodiments shown in FIGS. 16 and 17 may have greater or lesser modular sections and/or load port assemblies on the respective sides of sorter 100 in alternative embodiments. It is also contemplated that, in addition to load port assemblies 112 at the front of the sorter 100, at least one load port assembly be added to the side of the sorter adjacent to the front.

Figure 19:
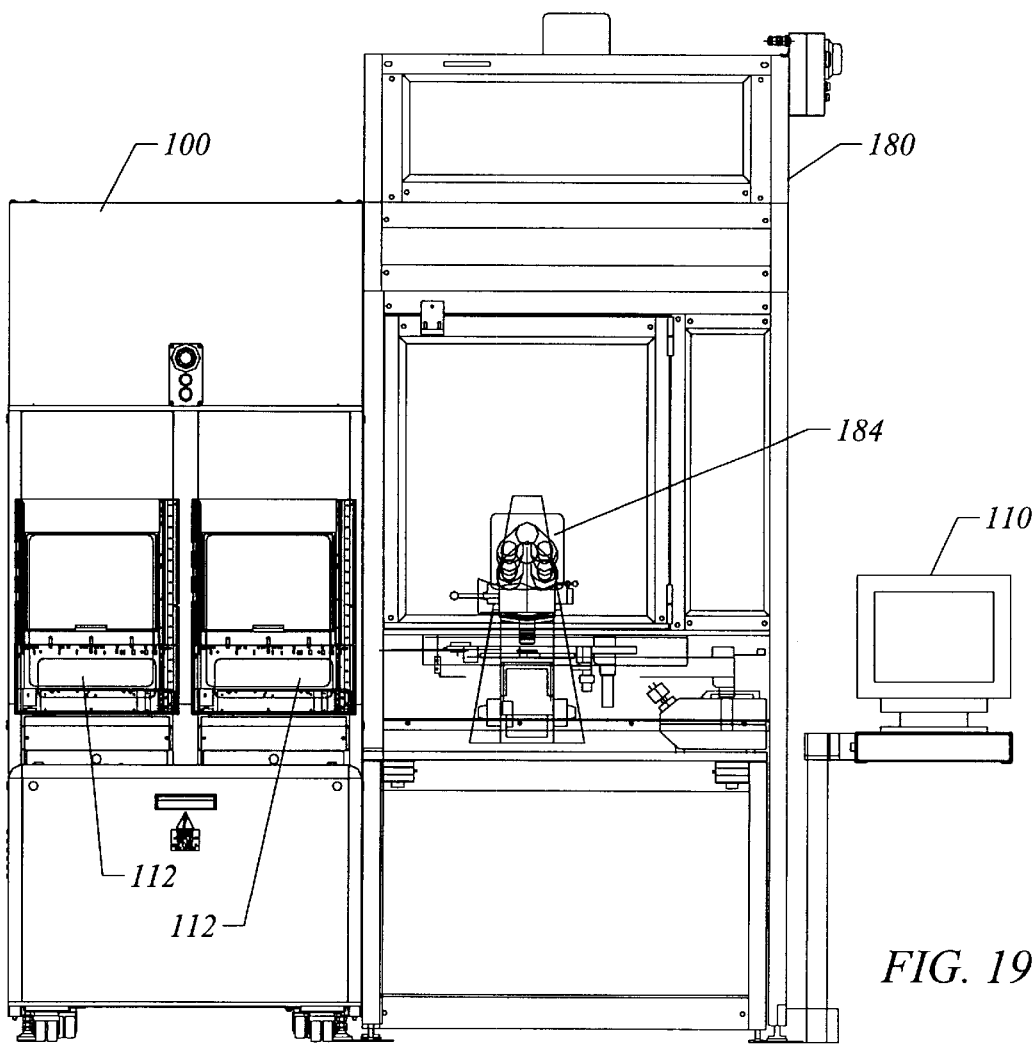

In a still further embodiment of the present invention shown in FIGS. 18 and 19, a work station 180 maybe adjoined to aside of the sorter 100 adjacent the front of the sorter including the load port assemblies 112. The workstation may be affixed via connector frame 156 as described above. In the embodiment shown in FIGS. 18 and 19, the work station 180 comprises a station where workpieces may be examined by a technician 182 under a microscope 184. In accordance with this embodiment, workpieces from cassettes on either load port assembly 112 may be transferred by robot 104 to a chuck 186 within station 180, whereupon the workpiece may be examined. Other types of work stations are contemplated. It is understood that the work station 180 may be affixed to the sorter 100 having a larger number of modular sections than shown in FIGS. 18 and 19. It is also contemplated that a work station be affixed to a rear of the sorter opposite the front side including the load port assemblies 112.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A processing tool for manipulating semiconductor wafers, comprising:
    an environment defined by an expandable frame for enclosing one or more modular sections; and
    at least two load port assemblies in the one or more modular sections, each load port assembly being capable of presenting a semiconductor wafer to said environment, the number of load port assemblies capable of increasing when the expandable frame expands to enclose additional modular sections in said environment.

2. A processing tool for manipulating semiconductor wafers as recited in claim 1, wherein said number of load port assemblies depends on a number of modular sections in said environment.

3. A processing tool for manipulating semiconductor wafers as recited in claim 1, wherein said environment can expand to enclose modular sections comprising up to four load port assemblies.

4. A processing tool for manipulating semiconductor wafers as recited in claim 1, wherein said one or more modular sections comprises a first modular section including two load port assemblies.

5. A processing tool for manipulating semiconductor wafers as recited in claim 4, wherein said one or more modular sections comprises a second modular section having a single load port assembly.

6. A processing tool for manipulating semiconductor wafers as recited in claim 4, wherein said one or more modular sections comprises a second modular section having two load port assemblies.

7. A processing tool for manipulating a semiconductor wafer, comprising:
    an environment formed of a modular section and expandable to include two modular sections, each modular section comprising at least one load port assembly for presenting a semiconductor wafer to the environment; and
    at least one tool within said environment for handling a semiconductor wafer presented at any load port assembly.

8. A processing tool for manipulating a semiconductor wafer as recited in claim 7, further comprising a removable end panel covering an end of said one modular section.

9. A processing tool for manipulating a semiconductor wafer as recited in claim 7, further comprising a connector for connecting said two modular sections.

10. A processing tool for manipulating a semiconductor wafer as recited in claim 7, wherein said at least one tool comprises a semiconductor handling robot.

11. A processing tool for manipulating a semiconductor wafer as recited in claim 7, wherein said at least one tool comprises an aligner.

12. A processing tool for manipulating a semiconductor wafer as recited in claim 11, wherein said aligner comprises a chuck capable of supporting a first semiconductor wafer and a buffer paddle capable of supporting a second semiconductor wafer while said chuck supports said first semiconductor wafer.

13. A processing tool for manipulating a semiconductor wafer, comprising:
    an environment comprising a modular section having two, side-by-side load port assemblies, the environment being capable of expanding to comprise two modular sections having three, side-by-side load port assemblies; and
    a single wafer handling robot capable of transferring the semiconductor wafer between any load port assembly of said environment regardless of whether the number of modular sections of said environment is one or two.

14. A processing tool for manipulating a semiconductor wafer, comprising:
    a first environment formed of a first modular section including at least two, side-by-side load port assemblies;
    a second environment formed of a second modular section including at least two, side-by-side load port assemblies;
    a connector for connecting said first and second environments; and
    a wafer handling robot capable of transferring a semiconductor wafer between any load port assembly of said first and second environments when connected by said connector.

15. A processing tool for manipulating a semiconductor wafer as recited in claim 14, wherein said wafer handling robot comprises a first wafer handling robot in said first environment capable of transferring the semiconductor wafer between said at least two load port assemblies in said first environment and at least one of said at least two load port assemblies in said second environment when said second environment is connected to said first environment.

16. A processing tool for manipulating a semiconductor wafer as recited in claim 15, farther comprising a second wafer handling robot in said second environment capable of transferring the semiconductor wafer between said at least two load port assemblies in said second environment and at least one of said at least two load port assemblies in said first environment.

17. A processing tool for manipulating a semiconductor wafer as recited in claim 16, further comprising a first controller for controlling components in said first environment.

18. A processing tool for manipulating a semiconductor wafer as recited in claim 17, further comprising a second controller for controlling components is said second environment.

19. A processing tool for manipulating a semiconductor wafer as recited in claim 18, further comprising a first graphical user interface associated with said first controller for allowing information to be transferred to and from said first controller.

20. A processing tool for manipulating a semiconductor wafer as recited in claim 19, further comprising a second graphical user interface associated with said second controller for allowing information to be transferred to and from said second controller.

21. A processing tool for manipulating a semiconductor wafer as recited in claim 16, further comprising a controller for controlling components in said first and second environments.

22. A processing tool for manipulating a semiconductor wafer as recited in claim 14, further comprising a first aligner in said first environment.

23. A processing tool for manipulating a semiconductor wafer as recited in claim 22, further comprising a second aligner in said second environment.

24. A stand alone processing tool for manipulating semiconductor wafers, comprising:
an environment having a volume and being defined by one or more one modular sections each having at least one load port assembly capable of presenting a semiconductor wafer to the environment, the volume of said environment depending on the number of modular sections defining the environment; and
at least one wafer handling tool within said environment capable of transferring a semiconductor wafer between any load port assemblies of the one or more modular sections.

25. A stand alone processing tool for manipulating semiconductor wafers, comprising:
an environment including a first number of modular sections in a first configuration, and capable of expanding to include a second number of modular sections in a second configuration, said second number of modular sections being greater than said first number of modular sections, each modular section in said first and second configurations comprising at least one load port assembly for presenting a semiconductor wafer to the environment;
a removable end plate capable of sealing a first modular section of said first number of modular sections when said environment is in said first configuration; and
a connector capable of connecting said first modular section to a second modular section of said second number of modular sections when said environment is in said second configuration.

26. A method of providing a sorter for semiconductor wafer fabrication processes, a first semiconductor wafer process requiring a sorter having two load port assemblies and a second semiconductor wafer process requiring a sorter having three load port assemblies, the method comprising the steps of:
(a) configuring the sorter in a first configuration for the first semiconductor wafer process, said step (a) of configuring the sorter comprising the steps of:
(i) providing the sorter with a first modular section including two load port assemblies, and
(ii) affixing a removable end plate on an end of the first modular section to define an enclosure within the first modular section; and (b) configuring the sorter in a second configuration for the second semiconductor wafer process, said step (b) of configuring the sorter comprising the steps of:
(i) removing the removable end plate from the first modular section,
(ii) affixing a removable connector frame to the end of the first modular section, and
(iii) affixing a second modular section including a third load port assembly to the removable connector frame to define an enclosure within the first and second modular sections.

27. A modular sorter for processing semiconductor wafers, comprising:
a modular section having two load port assemblies, each load port assembly capable of receiving a pod containing at least one semiconductor wafer in a cassette;
a frame defining an controlled environment for said modular section, said frame having a removable end panel; and
a robot capable of transferring wafers to and from either load port assembly in said modular section and a load port assembly in any additional modular sections in the controlled environment.

28. A modular sorter as recited in claim 27, wherein said frame is capable of expanding to include additional modular sections in the controlled environment.

29. A modular sorter as recited in claim 27, further comprising a control algorithm allowing said robot to move straight into and out of a wafer cassette in any said load port assembly of said modular sorter without being located directly in front of the load port assembly.

30. A modular sorter as recited in claim 27, wherein each load port assembly of a said modular section comprises a plate supporting a cassette, the plate being capable of rotating an opening in the cassette toward the robot.

31. A modular sorter as recited in claim 27, further comprising a connector frame for supporting any additional modular sections.

32. A modular sorter as recited in claim 27, further comprising a stiffening brace to provide additional rigidity to the frame and any additional modular sections.

33. A modular sorter as recited in claim 27, further comprising a graphical user interface in communication with the modular sorter.

34. A modular sorter as recited in claim 27, further comprising a pair of aligners for positioning the semiconductor wafers within the modular sorter.

35. A modular sorter as recited in claim 34, wherein each of said pair of aligners includes a buffer paddle allowing the aligner to concurrently process two wafers.

36. A modular sorter as recited in claim 27, wherein said robot includes an end effector comprising a dual platform, each platform capable of supporting a semiconductor wafer.

37. A modular sorter as recited in claim 27, further comprising connection ports for connecting any additional modular sections.

38. A modular sorter as recited in claim 27, further comprising a vertical drive unit for providing vertical translation to said robot inside said modular sorter.

39. A modular sorter as recited in claim 27, further comprising a second robot capable of transferring wafers to and from a load port assembly in said modular section and a load port assembly in any additional said modular sections.

40. A modular sorter as recited in claim 39, wherein each of said robot and said second robot are capable of transferring wafers to and from up to three load port assemblies.

41. A modular sorter for processing semiconductor wafers, comprising:

a modular section having n load port assemblies, each load port assembly capable of receiving a pod containing at least one semiconductor wafer in a cassette;

a frame defining an controlled environment for said modular section; and a robot capable of transferring wafers to and from any of the n load port assemblies in said modular section and any of m load port assemblies in any additional modular section in the controlled environment.

42. A modular sorter as recited in claim 41, wherein each load port assembly has a major load axis, and the major load axes of the load port assemblies are parallel.

43. A modular sorter for processing semiconductor wafers, comprising:

a first modular section having two load port assemblies, each load port assembly capable of receiving a pod containing at least one semiconductor wafer in a cassette;

a second modular section having one load port assembly capable of receiving a pod containing at least one semiconductor wafer in a cassette;

a frame defining an controlled environment for said first modular section and said second modular section; and a robot capable of transferring wafers to and from either load port assemblies in said first modular section and the load port assembly in said second modular section.

\* \* \* \* \*